(12) United States Patent  (10) Patent No.: US 7,279,886 B2
Huber                     (45) Date of Patent:      Oct. 9, 2007

(54) SLIDABLE MOUNTING PLATE

(75) Inventor: Werner Huber, Nussdorf/Inn (DE)

(73) Assignee: ESMO AG, Rosenheim (DE)

( * ) Notice: Subject to any disclaimer, the term of this patent is extended or adjusted under 35 U.S.C. 154(b) by 0 days.

(21) Appl. No.: 10/527,928

(22) PCT Filed: Sep. 19, 2003

(86) PCT No.: PCT/DE03/03134

§ 371 (c)(1),
(2), (4) Date: Mar. 16, 2005

(87) PCT Pub. No.: WO2004/029635

PCT Pub. Date: Apr. 8, 2004

(65) Prior Publication Data
US 2006/0164071 A1    Jul. 27, 2006

(30) Foreign Application Priority Data
Sep. 20, 2002 (DE) ................. 202 14 629

(51) Int. Cl.
G01R 31/02 (2006.01)
(52) U.S. Cl. .................................. 324/158.1
(58) Field of Classification Search .......... None
See application file for complete search history.

(56) References Cited

U.S. PATENT DOCUMENTS 5,450,766 A  9/1995 Holt ........................ 73/866.5
5,654,631 A * 8/1997 Ames ..................... 324/158.1
6,586,925 B2 * 7/2003 Ramesh et al. .......... 324/158.1
6,741,072 B2 * 5/2004 Orsillo .................... 324/158.1
6,756,800 B2 * 6/2004 Chiu et al. ................. 324/754
6,897,645 B2 * 5/2005 bin Mohamed Hassan ...... 324/158.1

FOREIGN PATENT DOCUMENTS

EP   0 237 698 A2   9/1987
EP   0 468 906 A2   1/1992
WO   WO 00/70355    11/2000

OTHER PUBLICATIONS

EPO, *International Search Report*, PCT/DE03/03134, Feb. 19, 2004 (5 pages).

* cited by examiner

*Primary Examiner*—Minh N. Tang
(74) *Attorney, Agent, or Firm*—Wood, Herron & Evans, LLP

(57) ABSTRACT

A mounting plate (1) having one or more parts for indirectly or directly attaching a tester (2) for electronic components on the one side and a handler (3) for electronic components on the other side, include at least a single plate (4) on the side of the tester and a single plate (5) on the side of the handler or three or more single plates which are slidable in opposite directions in the x and/or y and/or z direction and lockable.

17 Claims, 4 Drawing Sheets

SLIDABLE MOUNTING PLATE

This application is a continuation application of PCT application No. PCT/DE03/03134 filed on Sep. 19, 2003 which claims priority from Germany patent application No. 202 14 629.4 filed on Sep. 20, 2002, the contents of which are enclosed herein by reference.

FIELD OF THE INVENTION

The present invention relates to a mounting plate having two or more parts for non-positively and/or positively connecting a tester for electronic components on the one side to a handler for electronic components on the other side.

BACKGROUND OF THE INVENTION

In particular, the electronic components used according to the invention may be integrated circuits (IC's) or wafers which, for example, are produced on a silicon basis.

From the prior art it is known to directly attach a tester for electronic components to a handler for electronic components by means of a docking unit with centering pins.

Here, it is particularly disadvantageous that several different and expensive docking units must be purchased, maintained and stored if different handlers for different electronic components each having different dimensions and locking concepts, are to be connected to the same tester or if a handler is to be connected to several testers which are unalike.

As a rule, handlers for electronic components further comprise a plurality of adjacently disposed and forward and backward movable plungers by means of which the electronic components to be tested can travel in the direction of the centered contact base of an opposite tester for electronic components.

Mostly, merely a single plunger among this plurality of plungers present on the side of the handler is active in the form of a so-called "active contact sited".

During the test process the contact base on the side of the tester located in the center of the tester must be aligned centrally to the corresponding active plunger of the handler.

In order to make the mostly single centered contact base of the tester engage with the corresponding active, mostly eccentric plunger of the handler it is necessary in the devices of the prior art to dismount the tester completely and in a laborious and time-consuming manner from the handler, to replace the original docking unit by a docking unit adjusted to the new position, to carry out a time-consuming adjustment and to perform a final locking.

The time needed for such refit and thus the down-time of the overall test device for doing so is about 10 hours.

It is therefore the object of the present invention to provide a device for connecting a tester for electronic components on the one hand to a handler for electronic components on the other hand, which does not require purchasing, maintaining and stocking several different docking units even if various handlers or testers are used, and which allows for a particularly fast, simple, exact and low-cost adjustment of the position of the contact base(s) of a tester (test head) to the position of the corresponding active plunger (contact site) of an opposite handler, thus reducing down-time during change-over from one active plunger to another active plunger.

BRIEF DESCRIPTION OF THE DRAWINGS

Embodiments of the invention will be described in more detail by referring to the drawings, wherein.

DETAILED DESCRIPTION OF THE INVENTION

Figure 2:
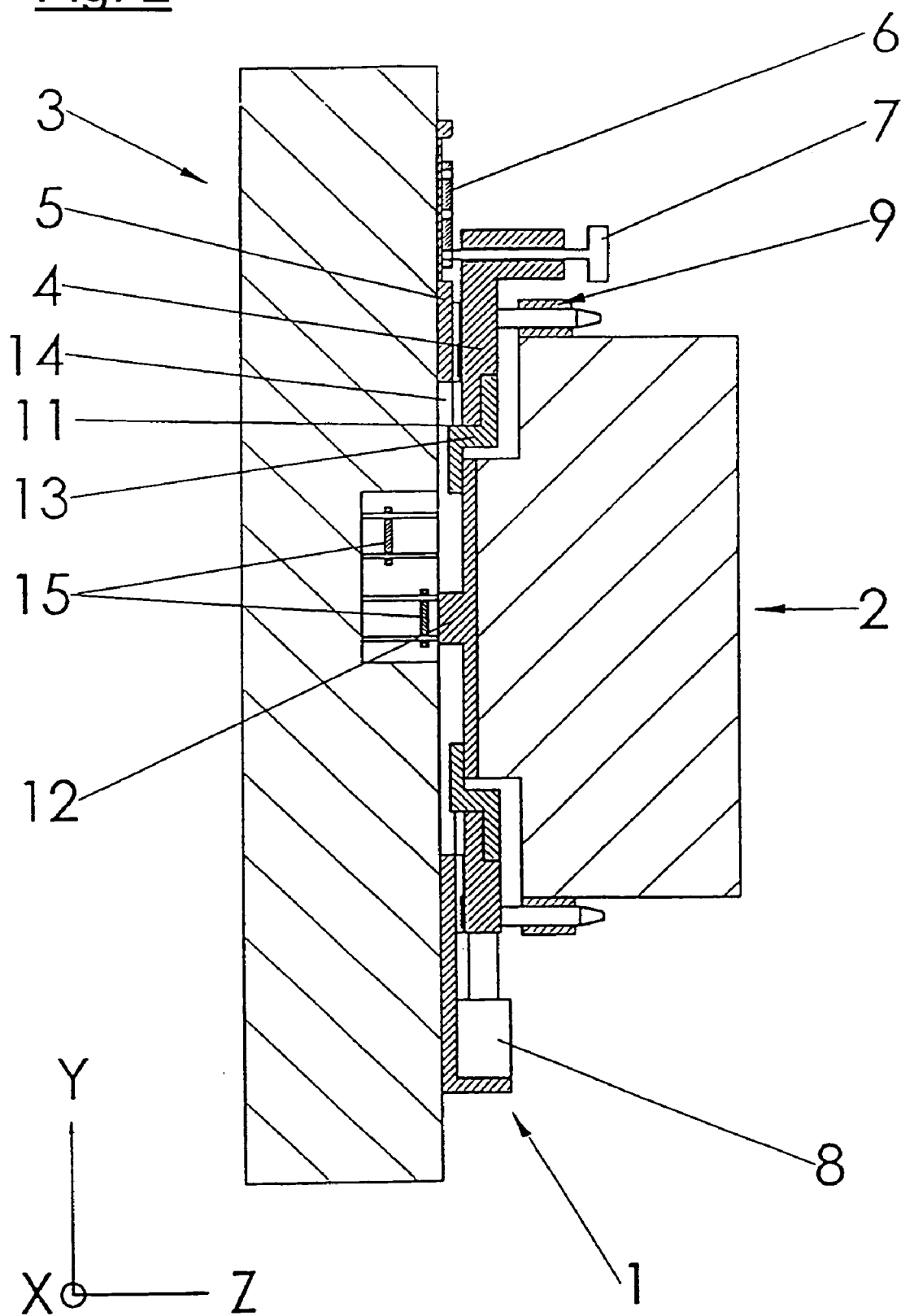
FIG. 2 is a schematic cross-sectional side view along line A-A in FIG. 1.

As can already be taken from FIG. 2, as a rule a tester (2; test head) for electronic components on the one side and a handler (3) for electronic components on the other side can be reversibly attached indirectly—such as via docking means (9) having two or more parts—or directly to the inventive mounting plate (1) having two or more parts.

Preferably, the mounting plate (1) according to the invention comprises at least a single plate (4) on the side of the tester and a single plate (5) on the side of the handler or three or more single plates which are slidable in opposite directions in the x and/or y and/or z direction and lockable.

The adjustability of the two or more single plates (4, 5) in the z direction can be performed optionally to have the surface on the side of the handler of the contact base (15) of the tester (2) lie against the back panel of the handler (3).

The slidability of the single plates (4, 5) of the mounting plate (1) in opposite directions can be effected, for example, by one or more roller or sliding bearings, ball bearing bushes, sliding guides, guide rollers, linear bearings, linear guides, radial bearings, air bearings or hydraulic bearings.

Figure 3:
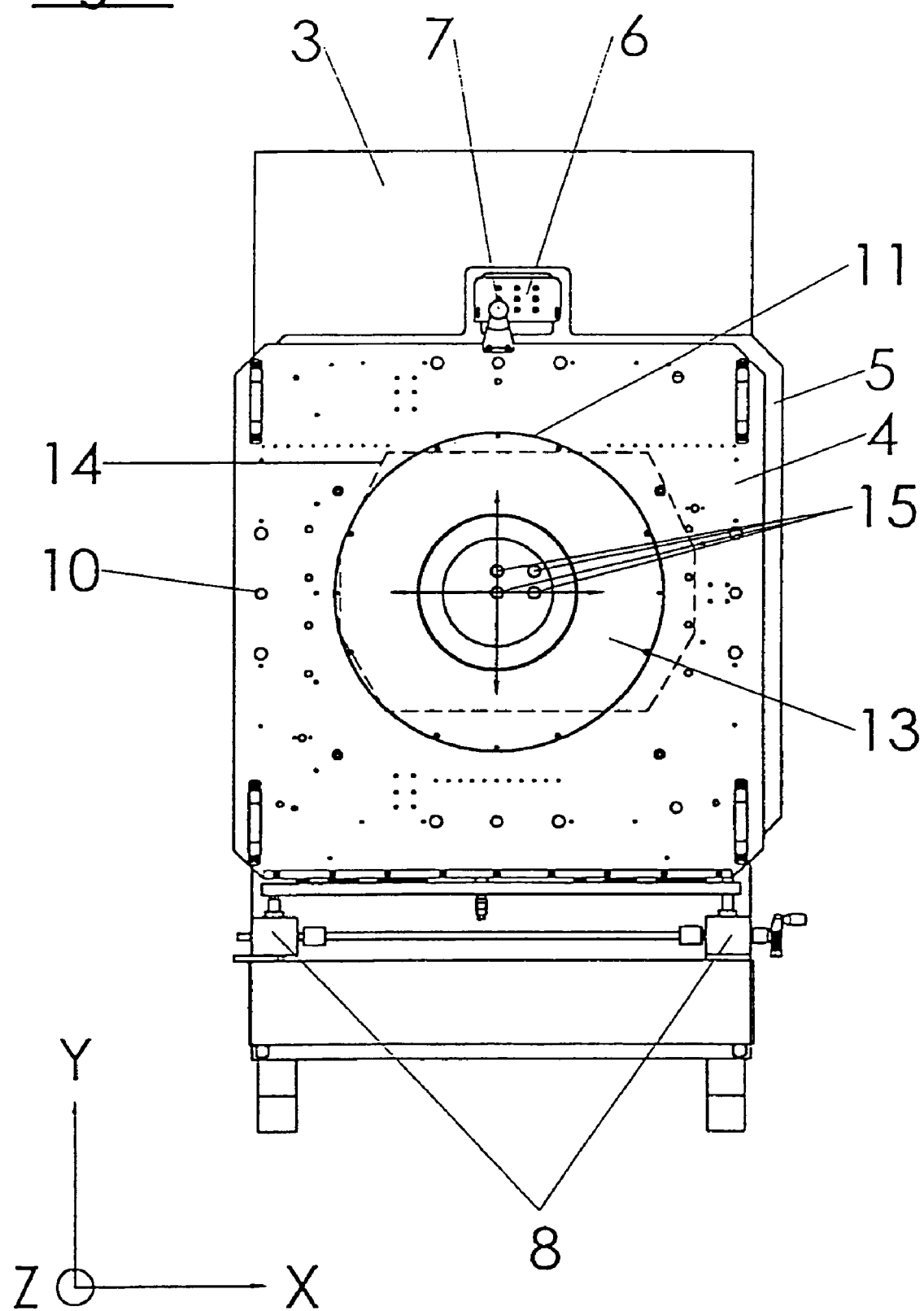
FIG. 3 is a schematic perspective view of a mounting plate according to the invention, seen from the side of a tester.
Figure 4:
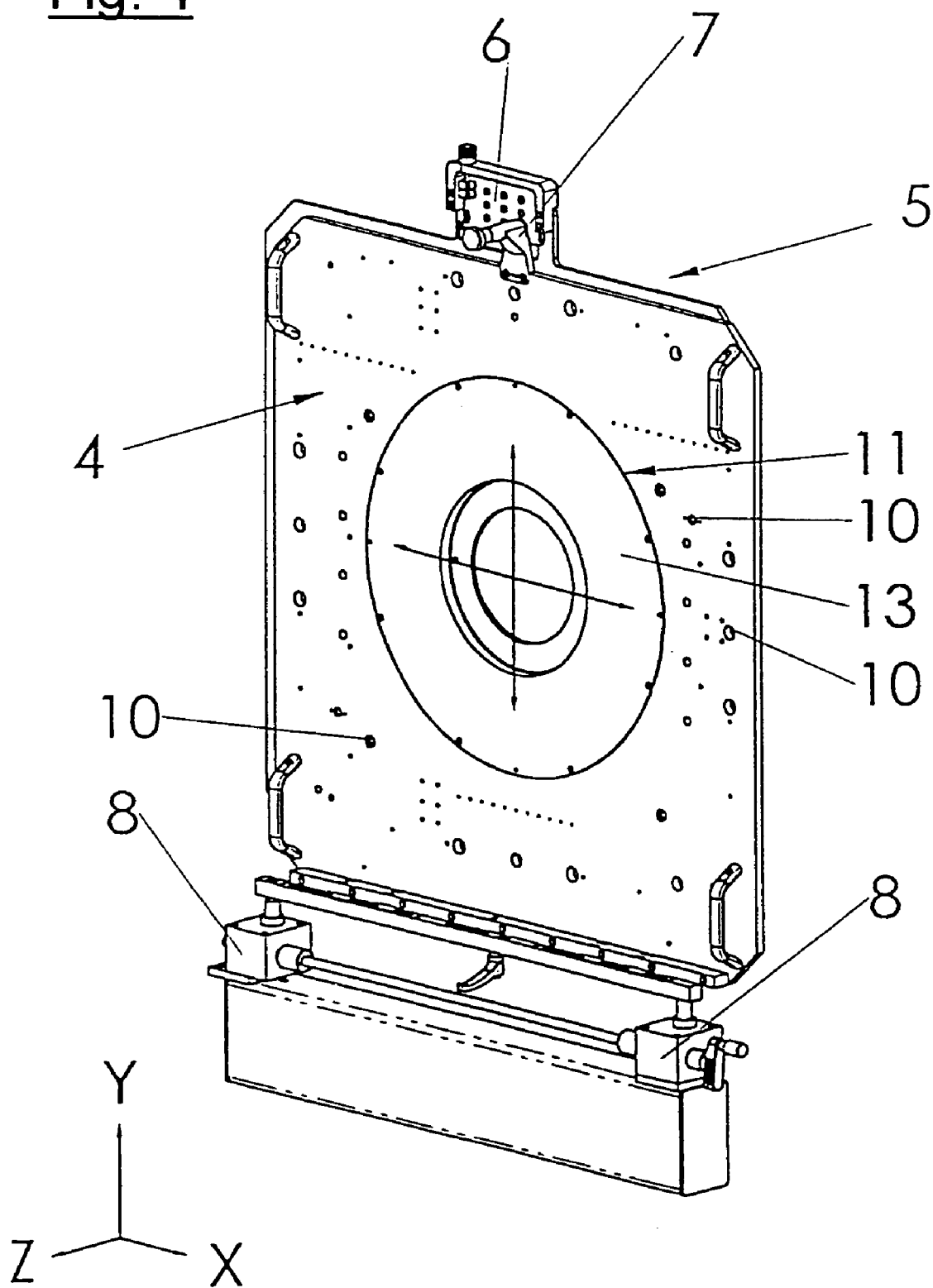
FIG. 4 is a schematic front view of a mounting plate according to the invention, seen from the side of a tester.

FIGS. 3 and 4 in particular show that the inventive mounting plate (1) for oppositely positioning the single plates (4, 5) may comprise two or more apertured plates (6) which are fixedly or slidably and lockably attached to one of the single plates (4 or 5).

It is obvious that in an alternative case the apertured plate (6) can e.g. be attached directly or indirectly to the handler (3) or the tester (2) itself.

The apertured plate (6) can be built as e.g. a plate with bores, a grid, a net or a frame with segments.

Preferably, two or more locking devices (7) attached to the other single plate (4), optionally on the side of the tester, reversibly mesh with the apertured plate (6) attached, for example, to the single plate (5) on the side of the handler or to the handler (3) or the tester (2).

The at least one locking device (7) may be developed e.g. in the form of a spring-loaded or not spring-loaded positioning pin, a snap mechanism, a clip-on mechanism or a press-on piece.

As a rule, the at least one apertured plate (6) is mounted exchangeably and is preferably supported adjustably in the x and/or y and/or z direction and lockable.

Preferably, the distances and locations of the bores of this apertured plate (6) correspond to the distances and locations of the plungers or contact sites of the handler (3).

Based on this correspondence of the positions of the recesses of the apertured plate (6) and the positions of the plungers on the side of the handler the centered contact base(s) (15) of a one-sided tester (2) can be centered above the active, mostly eccentric plunger(s) of a handler (3) on the other side, optionally by simply and quickly changing a hole within the same apertured plate (6).

If the handler (3) is changed, the original apertured plate (6) can also be exchanged quickly and simply for an apertured plate (6) adjusted to the plunger distances and plunger locations of the new handler (3).

In both above-stated cases the down-time and change-over time, respectively, of the whole tester, known and dreaded from the prior art, is reduced from about 10 hours to about 10 minutes, resulting in a dramatic improvement of the throughput and thus the economy of a tester equipped with the mounting plate (1) according to the invention.

Figure 1:
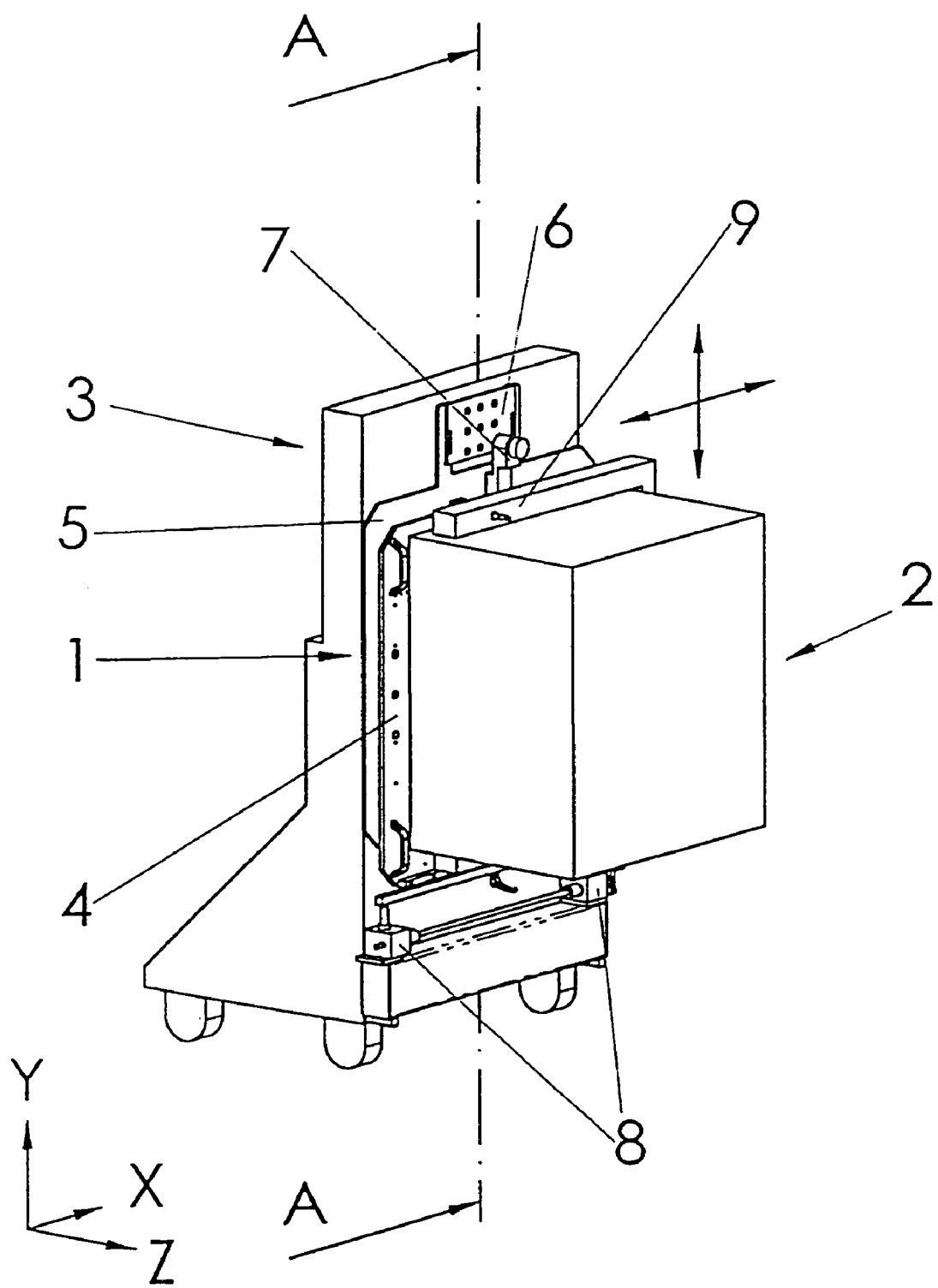
FIG. 1 is a schematic perspective view of an overall device for testing electronic components which on the one side of a central inventive mounting plate includes a handler for electronic components and a tester for testing electronic components on the other side of the central inventive mounting plate.

As can be taken from FIGS. 1, 3 and 4, in a preferred embodiment the inventive mounting plate (1) may comprise, for example, a self-locking height adjustment (8) acting at least in the y direction for the sliding single plate (4) carrying a tester (2) on the side of the tester.

In case the locking device (7) is unlocked, an unintended sinking of the sliding single plate (4) on the side of the tester with the tester (2) attached thereto can be safely avoided owing to such self-locking height adjustment.

The self-locking height adjustment (8) acting at least in the y direction may be developed e.g. in the form of an electric, hydraulic, pneumatic or mechanic adjustment device or a spindle mechanism, rack mechanism, a belt, a chain or in the form of straps, ropes or Bowden cables.

In a particularly preferred embodiment, the mounting plate according to the invention further comprises safety means which permit the single plates (4, 5) to slide in opposite directions only after they have been deactivated.

On principle, the slidability of the single plates (4, 5) in opposite directions may be performed manually and/or hydraulically and/or pneumatically and/or electrically and/or mechanically.

Optionally, on the single plate (4) on the side of the tester two or more docking means (9) for indirectly attaching and positioning the tester (2; test head) to the single plate (4) on the side of the tester may be mounted reversibly or irreversibly.

Thus, the single plate (4) on the side of the tester may include two or more recesses (10), bores with or without threads, structures, adapters, hooks or connecting links for reversibly attaching docking means (9) having two or more parts or for directly attaching a tester (2).

As can be taken from FIGS. 3 and 4 in particular, in preferred embodiments the inventive mounting plate (1) may include a central, round or polygonal recess (11) in its single plate (4) on the side of the tester for reversibly, directly or indirectly receiving a device under test board (12) acting between the tester (2) and the handler (3).

Optionally, a device under test board support (13) adapted on the outside to the shape of the recess (11) and on the inside to the shape of the device under test board (12) can be inserted reversibly as well as loosely fitting or substantially gastight into the recess (11) of the single plate (4) on the side of the tester. As a rule, the device under test board support (13) is developed to be annular, strut-shaped, grid-shaped, square, rectangular or polygonal as well as electrically insulating.

The advantage of an electrically insulating development of the device under test board support (13) lies in safely avoiding the danger of a destructive short-circuit.

Corresponding to the central recess (11) of the single plate (4) on the side of the tester the single plate (5) on the side of the handler may also include a recess (14) located in the center for receiving and/or guiding the contact base(s) (15) of a handler (3).

In summary it can be stated that within the frame of the present invention a device is provided in the shape of a mounting plate for connecting a tester for electronic components on the one side to a handler for electronic components on the other side.

For the first time, by using the inventive mounting plate (1), which is slidable with regard to its single plates (4, 5), the purchase, maintenance and stocking of several different expensive docking units is no longer necessary even if different handlers or testers are used.

Moreover, the mounting plate (1) according to the invention allows for a particularly fast, simple, exact and low-cost adjustment of the position of the contact base(s) (15) of a tester (2; test head) to the potion of the corresponding active plunger (contact site) of an opposite handler (3).

Consequently, the down-time of the handler (3) during change-over from one active plunger to another active plunger will be drastically reduced due to the inventive mounting plate (1) and thus the throughput and the economy, respectively, of the overall tester will be considerably enhanced.

We claim:

1. A mounting plate having a first side and an opposite second side and comprising one or more parts for indirectly or directly attaching a tester for electronic components on the first side and a handler for electronic components on the second side, characterized in that the mounting plate comprises at least a single plate on the side of the tester to which the tester is attachable and movable therewith and a single plate on the side of the handler to which the handler is attachable, said single plates extending in a plane defined by an x-direction and a y-direction and being slidable against each other in the x direction and/or y direction and/or in a z direction extending out of the plane defined by x direction and y direction so as to provide movement of the tester relative to the handler, and the single plates being lockable relative to each other in a plurality of different positions.

2. The mounting plate according to claim 1, further comprising one or more of rollers or sliding bearings, ball bearing bushes, sliding guides, guide rollers, linear bearings, linear guides, radial bearings, air bearings or hydraulic bearings between the single plates for providing slidability.

3. The mounting plate according to claim 1, characterized in that for positioning the single plates with respect to each other, the mounting plate comprises at least one apertured plate fixedly or slidably and lockably attached to one of the single plates with which at least one locking means mounted on the other single plate engages reversibly.

4. The mounting plate according to claim 3, characterized in that the apertured plate is exchangeable, with the distances and locations of the bores of the apertured plate corresponding to the distances and locations of the plungers or contact sites of the handler such that by simply engaging another hole within the at least one apertured plate the central contact base of the tester is centered above the active plunger of the handler, and, if the handler is changed, with the original apertured plate being exchangeable for another apertured plate adjusted to the plunger distances and plunger locations of a new handler.

5. The mounting plate according to claim 4, characterized in that the single plate on the side of the handler includes a recess centered in the middle for receiving and/or guiding the plunger of the handler.

6. The mounting plate according to claim 4, characterized in that the adjustability of the single plates is performed in the z direction to make the surface of a contact base of the tester facing the handler abut against a back panel of the handler.

7. The mounting plate according to claim 3, characterized in that the at least one apertured plate is supported adjustably in the x and/or y and/or z direction and is lockable in the adjusted position.

8. The mounting plate according to claim 3, characterized in that the at least one locking means is built as a spring-loaded or not spring-loaded positioning pin, a snap mechanism, a clip-on mechanism or a press-on piece.

9. The mounting plate according to claim 8, further comprising a self-locking height adjustment acting at least in the y direction for the sliding single plate carrying the tester such that in case the at least one locking means is unlocked, an unintended sinking of the sliding single plate on the side of the tester with the tester attached thereto is avoided.

10. The mounting plate according to claim 9, characterized in that the self-locking height adjustment acting in the y direction is built as an electric, hydraulic, pneumatic or mechanic adjustment device or a spindle mechanism, rack mechanism, a belt, a chain or in the form of straps, ropes or Bowden cables.

11. The mounting plate according to claim 1, further comprising a safety means which allows the single plates to slide relative to each other only after the safety means has been deactivated.

12. The mounting plate according to claim 1, characterized in that the slidability of the single plates against each other is performed manually and/or hydraulically and/or pneumatically and/or electrically and/or mechanically.

13. The mounting plate according to claim 1, characterized in that on the single plate on the side of the tester one or more docking devices is reversibly or irreversibly mounted for attaching and positioning the tester to the single plate on the side of the tester.

14. The mounting plate according to claim 1, characterized in that the single plate on the side of the tester includes two or more recesses, bores with or without threads, structures, adapters, hooks or connecting links for reversibly attaching docking means of the tester having two or more parts or for directly attaching the tester.

15. The mounting plate according to claim 1, characterized in that the single plate on the side of the tester includes a central, round or polygonal recess for reversibly, indirectly or directly receiving a device under test board acting between the tester and the handler.

16. The mounting plate according to claim 15, characterized in that a device under test board support having an inside and an outside and adapted on the outside to the shape of the recess and on the inside to the shape of the device under test board is inserted in a reversible as well as loosely fitting or substantially gastight manner into the recess of the single plate on the side of the tester.

17. The mounting plate according to claim 16, characterized in that the device under test board support is developed to be annular, strut-shaped, grid-shaped, square, rectangular or polygonal as well as electrically insulating.

* * * * *